(12) United States Patent
Jung et al.

(10) Patent No.: US 11,790,971 B2
(45) Date of Patent: Oct. 17, 2023

(54) FERROELECTRIC RANDOM ACCESS MEMORY DEVICE AND METHOD FOR OPERATING READ AND WRITE THEREOF

(71) Applicant: INDUSTRY-ACADEMIC COOPERATION FOUNDATION, YONSEI UNIVERSITY, Seoul (KR)

(72) Inventors: Seong Ook Jung, Seoul (KR); Dong Han Ko, Seoul (KR); Tae Woo Oh, Seoul (KR); Se Hee Lim, Seoul (KR); Se Keon Kim, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 27 days.

(21) Appl. No.: 17/568,065

(22) Filed: Jan. 4, 2022

(65) Prior Publication Data
US 2022/0215870 A1    Jul. 7, 2022

(30) Foreign Application Priority Data

Jan. 6, 2021   (KR) .......................... 10-2021-0001355

(51) Int. Cl.
*G11C 11/22* (2006.01)

(52) U.S. Cl.
CPC ...... *G11C 11/2273* (2013.01); *G11C 11/2255* (2013.01); *G11C 11/2257* (2013.01); *G11C 11/2259* (2013.01); *G11C 11/2275* (2013.01); *G11C 11/2297* (2013.01)

(58) Field of Classification Search
CPC .......... G11C 11/2273; G11C 11/2255; G11C 11/2257; G11C 11/2259; G11C 11/2275; G11C 11/2297; G11C 11/223
See application file for complete search history.

(56) References Cited

U.S. PATENT DOCUMENTS

| 6,191,441 B1 * | 2/2001 | Aoki ...................... H10B 53/00 |
| | | 257/532 |
| 6,198,651 B1 * | 3/2001 | Lee .......................... G11C 11/22 |
| | | 365/145 |
| 6,373,743 B1 * | 4/2002 | Chen ....................... G11C 11/22 |
| | | 365/145 |

(Continued)

FOREIGN PATENT DOCUMENTS

| KR | 10-0487417 B1 | 6/2003 |
| KR | 10-2004-0052018 A | 6/2004 |

*Primary Examiner* — Jay W. Radke

(57) ABSTRACT

A ferroelectric random access memory device comprises: a memory cell array including a plurality of memory cells each having one ferroelectric transistor (FeFET) connected between a read line of a plurality of read lines and a source line of a plurality of source lines and one transistor connected between a bit line of a plurality of bit lines and a gate of the FeFET and having a gate connected to a corresponding word line of a plurality of word lines; and a read/write control unit, when address information for a memory cell to be written is applied with a write command and data, selecting a word line and a read line corresponding to a row address and applying a write voltage having a positive voltage level, and applying a ground voltage to the selected read line, and applying the write voltage to a bit line corresponding to a memory cell.

17 Claims, 10 Drawing Sheets

(56) References Cited

U.S. PATENT DOCUMENTS

| | | | |
|---|---|---|---|
| 8,467,232 B2* | 6/2013 | Matsuzaki | H10B 41/70 |
| | | | 365/149 |
| 8,576,620 B2* | 11/2013 | Yamazaki | G11C 11/40 |
| | | | 365/182 |
| 9,287,370 B2* | 3/2016 | Kurokawa | H01L 29/26 |
| 2004/0061153 A1 | 4/2004 | Misewich et al. | |
| 2004/0174729 A1* | 9/2004 | Sakai | G11C 11/22 |
| | | | 365/145 |
| 2005/0145891 A1* | 7/2005 | Abe | G09G 3/3241 |
| | | | 257/288 |
| 2014/0198560 A1* | 7/2014 | Lee | G11C 8/16 |
| | | | 365/149 |
| 2018/0366476 A1 | 12/2018 | Liu | |
| 2022/0215870 A1* | 7/2022 | Jung | G11C 11/2255 |
| 2022/0392508 A1* | 12/2022 | Li | G11C 11/5657 |

\* cited by examiner

FERROELECTRIC RANDOM ACCESS MEMORY DEVICE AND METHOD FOR OPERATING READ AND WRITE THEREOF

CROSS-REFERENCE TO RELATED APPLICATIONS

This application claims priority under 35 U.S.C. 119(a) to Korean Patent Application No. 10-2021-0001355, filed on Jan. 6, 2021, in the Korean Intellectual Property Office, the disclosure of which is incorporated herein in its entirety by reference.

BACKGROUND

1. Technical Field

The present disclosure relates to a ferroelectric random access memory device and a method for operating read/write thereof, more particularly to a ferroelectric random access memory device that operates read and write with low power and a method for operating read/write thereof.

2. Description of the Related Art

Non-Volatile Memory (NVM) has the advantage of not only not consuming standby power as data can be maintained even when the power is cut off in standby mode, but also having a higher degree of integration than volatile memory, which is advantageous for high-capacity implementation.

FIG. 1 shows a structure of a ferroelectric random access memory element, and FIG. 2 shows a hysteresis characteristic of a ferroelectric random access memory element.

Among non-volatile memories, a ferroelectric random access memory (hereinafter FeRAM) is a memory device that uses a ferroelectric as a memory element. Conventionally, ferroelectrics were mainly applied to capacitor elements, but now, as shown in FIG. 1, ferroelectric transistor (Ferroelectric FET: hereinafter FeFET) elements having a structure in which a ferroelectric layer is added between a gate and an oxide layer in a MOSFET structure are receiving much attention. When a ferroelectric random access memory is configured with an FeFET element as shown in FIG. 1, it has advantages of excellent performance, such as excellent compatibility with CMOS circuits, high ON/OFF ratio ($10^6$) and fast write speed (10 ns) and low write power consumption compared to other conventional non-volatile memories such as STT-MRAM, PRAM and ReRAM.

As shown in FIG. 2, in the FeFET element, the threshold voltage ($V_{TH}$) varies depending on the gate-source voltage ($V_{GS}$) or the gate-drain voltage ($V_{GD}$) according to the hysteresis characteristic of the ferroelectric. Accordingly, one bit of data can be stored using a variable threshold voltage ($V_{TH}$). In general, among the variable threshold voltages ($V_{TH}$), the first threshold voltage ($V_{TH1}$) of a relatively low voltage level is designated to store logic 1, and the second threshold voltage ($V_{TH2}$) of the relatively high voltage level is designated to store logic 0.

As shown in FIG. 1, the FeFET element has a three-terminal structure of source-gate-drain, and the read/write paths are different, so there are advantages in that the chances of read/write failures are very low and the structure of the write circuit is simple.

Meanwhile, for conventional ferroelectric random access memories, 1 FeFET structure in which each cell consists of one FeFET, 1T+1FeFET structure of one transistor and one FeFET, 2T+1FeFET structure of two transistors and one FeFET, and the like are being used.

In the 1 FeFET structure, since each cell is composed of one FeFET, the cell size is small and the degree of integration is high, but there is a problem that write disturbance may occur. In addition, in the 1T+1FeFET structure, although write disturbance does not occur, there is a problem that a threshold voltage drop may occur, and in the 2T+1FeFET structure, there is a problem that not only a threshold voltage drop may occur, but also the degree of integration is lowered due to a large cell area.

In particular, in all of the 1 FeFET, 1T+1FeFET, and 2T+1FeFET structures, the conventional read/write method has a disadvantage in that power consumption is large during a read/write operation, and there is an inconvenience of using a negative voltage during the write operation.

SUMMARY

An object of the present disclosure is to provide a ferroelectric random access memory device capable of reducing power consumption during a read/write operation and a method for operating read/write thereof.

Another object of the present disclosure is to provide a ferroelectric random access memory device capable of performing a read/write operation with fewer types of voltage level and a method for operating read/write thereof.

A ferroelectric random access memory device according to an embodiment of the present disclosure, conceived to achieve the objectives above, comprises a memory cell array including a plurality of memory cells each having one ferroelectric transistor (hereinafter, FeFET) connected between a corresponding read line of a plurality of read lines and a corresponding source line of a plurality of source lines and one transistor connected between a corresponding bit line of a plurality of bit lines and a gate of the FeFET and having a gate connected to a corresponding word line of a plurality of word lines; and a read/write control unit, when address information for a memory cell to be written is applied together with a write command and data to be stored, in a first step selecting a word line and a read line corresponding to a row address of the address information from among a plurality of word lines and a plurality of read lines and applying a write voltage having a pre-designated positive voltage level, and in a second step applying a ground voltage to the selected read line, and applying the write voltage to a bit line corresponding to a memory cell to which data of 1 is to be written according to a column address of the address information among a plurality of bit lines.

In the FeFET, the pattern of the hysteresis curve may be shifted in the positive voltage direction so that a first threshold voltage of a relatively low voltage level for storing data of 1 and a second threshold voltage of a relatively high voltage level for storing data of 0 have positive voltage levels.

The read/write control unit, in the first step, may apply a ground voltage to unselected word lines and read lines and the plurality of bit lines, and may float the plurality of source lines.

The read/write control unit, in the second step, may apply a ground voltage to a bit line corresponding to a memory cell to be maintained as data of 0, and may float the plurality of source lines.

When a read command and address information for a memory cell storing data to be read are applied, the read/write control unit may select a word line corresponding to a row address of the address information from among a plurality of word lines, apply a pre-designated data voltage to the selected word line, select a read line corresponding to the row address from among the plurality of read lines, apply a pre-designated drain read voltage to the selected read line, and apply a pre-designated gate read voltage to the plurality of bit lines.

The read/write control unit may apply a ground voltage to unselected word lines and unselected read lines, and may float the plurality of source lines.

The ferroelectric random access memory device may further comprise a sense amplifier unit comprising a plurality of sense amplifiers connected to each of the plurality of source lines to determine data stored in the memory cells by amplifying a voltage applied from the memory cells through the source lines.

The read/write control unit may comprise: a row decoder receiving and decoding a row address, selecting a read line and a word line corresponding to a row address among the plurality of read lines and the plurality of word lines, applying a write voltage to the selected read line and word line in response to a write command, and applying a drain read voltage and the data voltage to the selected read line and word line, respectively, in response to the read command; a column decoder receiving and decoding a column address and outputting; and a data input/output unit, when a write command is applied, receiving the decoded column address and data to be stored, applying the write voltage to a bit line corresponding to a memory cell in which data of 1 of the received data is to be stored, and when a read command is applied, applying a gate read voltage to the plurality of bit lines to obtain data determined by the plurality of sense amplifiers.

The write voltage may have a pre-designated voltage level higher than the second threshold voltage, the gate read voltage and the data voltage may have a voltage level between the first threshold voltage and the second threshold voltage, and the drain read voltage may have a voltage level between the gate read voltage and the write voltage.

A read/write method of a ferroelectric random access memory device according to another embodiment of the present disclosure, conceived to achieve the objectives above, including a plurality of memory cells each having one ferroelectric transistor (hereinafter, FeFET) connected between a corresponding read line of a plurality of read lines and a corresponding source line of a plurality of source lines and one transistor connected between a corresponding bit line of a plurality of bit lines and a gate of the FeFET and having a gate connected to a corresponding word line of a plurality of word lines, comprises: a first step of, when address information for a memory cell to be written is applied together with a write command and data to be stored, selecting a word line and a read line corresponding to a row address of the address information from among a plurality of word lines and a plurality of read lines and applying a write voltage having a pre-designated positive voltage level, thereby writing data of 0 to all memory cells in a corresponding row; and a second step of applying a ground voltage to the selected read line, and applying the write voltage to a bit line corresponding to a memory cell to which data of 1 is to be written according to a column address of the address information among a plurality of bit lines.

Accordingly, the ferroelectric random access memory device and a method for operating read/write thereof according to an embodiment of the present disclosure, can perform a read/write operation with fewer types of voltage level as well as not using a negative voltage, and can reduce power consumption during a read/write operation.

DETAILED DESCRIPTION OF THE INVENTION

Figure 1:
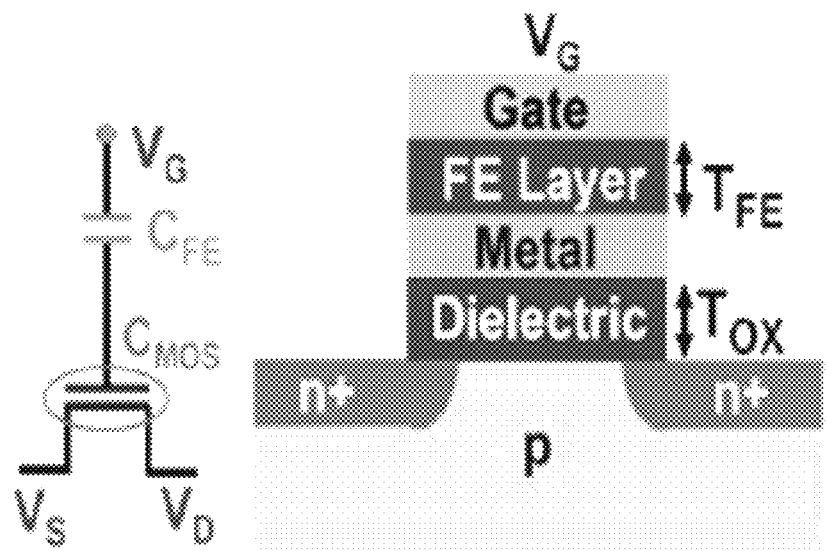
FIG. 1 shows a structure of a ferroelectric random access memory element.
Figure 2:
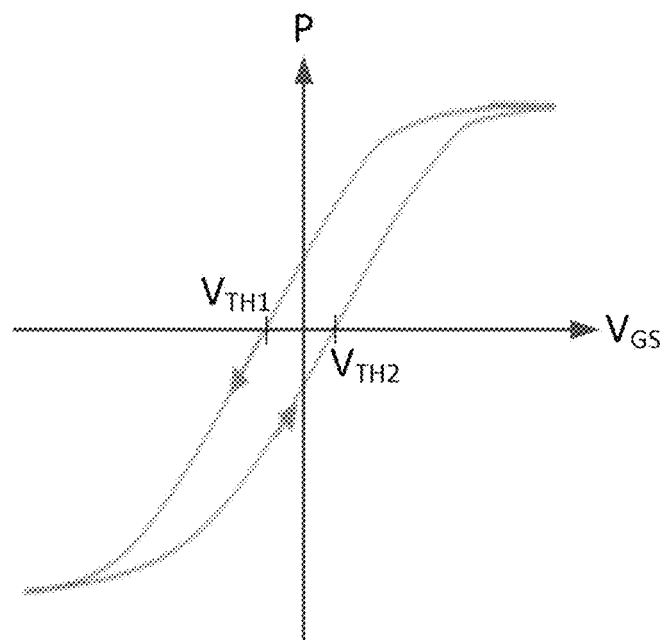
FIG. 2 shows a hysteresis characteristic of a ferroelectric random access memory element.

In order to fully understand the present disclosure, operational advantages of the present disclosure, and objects achieved by implementing the present disclosure, reference should be made to the accompanying drawings illustrating preferred embodiments of the present disclosure and to the contents described in the accompanying drawings.

Hereinafter, the present disclosure will be described in detail by describing preferred embodiments of the present disclosure with reference to accompanying drawings. However, the present disclosure can be implemented in various different forms and is not limited to the embodiments described herein. For a clearer understanding of the present disclosure, parts that are not of great relevance to the present disclosure have been omitted from the drawings, and like reference numerals in the drawings are used to represent like elements throughout the specification.

Throughout the specification, reference to a part "including" or "comprising" an element does not preclude the existence of one or more other elements and can mean other elements are further included, unless there is specific mention to the contrary. Also, terms such as "unit", "device", "module", "block", and the like described in the specification refer to units for processing at least one function or operation, which may be implemented by hardware, software, or a combination of hardware and software.

Figure 3A:
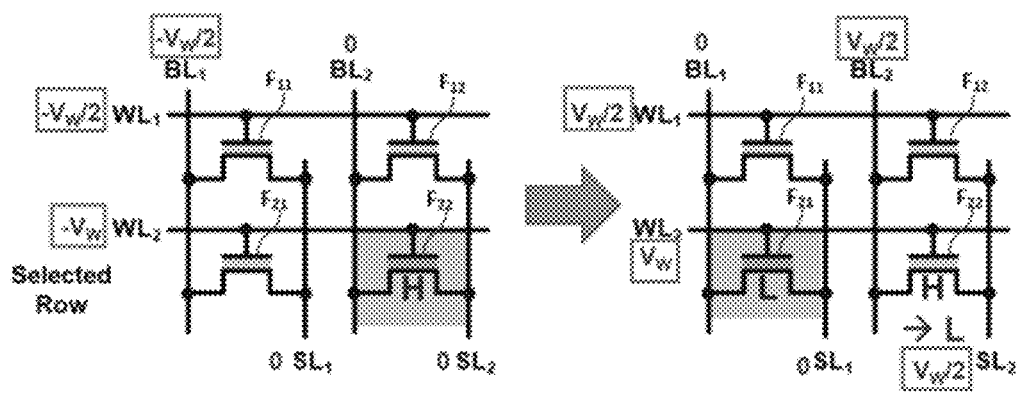
FIGS. 3A and 3B are a diagram for explaining a read/write operation of a ferroelectric random access memory device having a 1 FeFET structure.
Figure 3B:
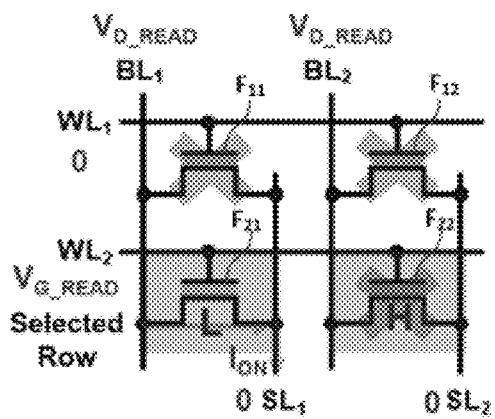

FIGS. 3A and 3B are a diagram for explaining a read/write operation of a ferroelectric random access memory device having a 1 FeFET structure.

FIGS. 3A and 3B show four memory cells by way of example, each consisting of one FeFET ($F_{11}$, $F_{12}$, $F_{21}$, $F_{22}$), in which two word lines ($WL_1$, $WL_2$), two bit lines ($BL_1$, $BL_2$) and a plurality of source lines ($SL_1$, $SL_2$) intersect in a memory cell array including a plurality of memory cells defined by a plurality of word lines (WL), a plurality of bit lines (BL) and a plurality of source lines (SL). FIG. 3A shows a write operation, and FIG. 3B shows a read operation.

Referring to FIG. 3A, in the ferroelectric random access memory device having a 1 FeFET structure, a write operation may be performed in two steps: writing data of 0 and writing data of 1. Here, a process of writing data of 1 and 0 to two memory cells corresponding to the second word line ($WL_2$) among the two word lines ($WL_1$, $WL_2$) among the four memory cells will be described as an example. That is, it represents a process in which the second row is selected and data is written.

In the ferroelectric random access memory device of the 1 FeFET structure, in order to first write data of 0 to the 22nd FeFET ($F_{22}$), a pre-designated negative write voltage ($-V_W$) is applied to the selected second word line ($WL_2$), and a voltage ($-V_W/2$) of ½ level of the negative write voltage ($-V_W$) is applied to the remaining unselected word lines ($WL_1$).

Meanwhile, the second bit line ($BL_2$) corresponding to the 22nd FeFET ($F_{22}$) to which data of 0 is to be written is maintained at a pre-designated ground voltage, while a voltage ($-V_W/2$) of ½ level of the negative write voltage ($-V_W$) is applied to the remaining bit line ($BL_1$), like the unselected word line ($WL_1$). At this time, all of the source lines ($SL_1$, $SL_2$) are maintained at a ground voltage.

Accordingly, since a negative write voltage ($-V_W$) is applied to the gate of the 22nd FeFET ($F_{22}$) through the second word line ($WL_2$), and a ground voltage is maintained for the second bit line ($BL_2$) and the second source line ($SL_2$), a voltage difference equal to the negative write voltage ($-V_W$) is applied between the gate-source and gate-drain, and thus a negative write voltage ($-V_W$) is applied to the ferroelectric disposed between the gate and the oxide layer, so that the threshold voltage ($V_{TH}$) of the 22nd FeFET ($F_{22}$) is increased to the second threshold voltage ($V_{TH2}$).

Thereafter, in the step of writing data of 1 to the 21st FeFET ($F_{21}$), a positive write voltage ($V_W$) is applied to the second word line ($WL_2$), and a voltage ($V_W/2$) of ½ level of the positive write voltage ($V_W$) is applied to the remaining unselected word line ($WL_1$). In addition, a ground voltage is applied to the first bit line ($BL_1$) and the first source line ($SL_1$) corresponding to the 21st FeFET ($F_{21}$) to which data of 1 is to be written, while a voltage ($V_W/2$) of ½ level of a positive write voltage ($V_W$) is applied to the remaining bit line ($BL_2$) and source line ($SL_2$).

That is, unlike the 22nd FeFET ($F_{22}$) in which data of 0 is written, a positive write voltage ($V_W$) is applied to the gate of the 21st FeFET ($F_{21}$), so that the threshold voltage ($V_{TH}$) of the 21st FeFET ($F_{21}$) is lowered to the first threshold voltage ($V_{TH1}$).

As a result, the 21st FeFET ($F_{21}$) has a relatively low first threshold voltage ($V_{TH1}$), and the 22nd FeFET ($F_{22}$) has a relatively high second threshold voltage ($V_{TH2}$) to store data 1 and 0.

Referring to FIG. 3B, in the read process, a ferroelectric random access memory device of the same 1 FeFET structure applies a pre-designated gate read voltage ($V_{G\_READ}$) to the second word line ($WL_2$) corresponding to the selected row, applies a pre-designated drain read voltage ($V_{D\_READ}$) to all the bit lines ($BL_1$, $BL_2$), and measures the current ($I_{ON}$) flowing through the source lines ($SL_1$, $SL_2$) to determine the data stored in the FeFET ($F_{21}$, $F_{22}$) on the selected second word line ($WL_2$). At this time, since the 21st FeFET ($F_{21}$) has a first threshold voltage (Van) that is a negative voltage level, while the 22nd FeFET ($F_{22}$) has a second threshold voltage ($V_{TH2}$) that is a positive voltage level, a current ($I_{ON}$) flows through the 21st FeFET ($F_{21}$), whereas no current flows through the 22nd FeFET ($F_{22}$). Accordingly, data stored in the 21st FeFET ($F_{21}$) and the 22nd FeFET ($F_{22}$) can be easily determined.

As described above, in the ferroelectric random access memory device of the 1 FeFET structure shown in FIGS. 3A and 3B, since a memory cell is composed of only one FeFET, there is an advantage in that the degree of integration can be greatly improved.

However, looking again at the case of writing data of 0 to the 22nd FeFET ($F_{22}$) on the left in FIG. 3A, since a voltage ($-V_W/2$) of ½ level of the negative write voltage ($-V_W$) is applied to the first word line ($WL_1$) to the 12th FeFET ($F_{12}$) and a ground voltage is applied to the second bit line ($BL_2$) and the second source line ($SL_2$), a voltage difference is generated between the gate-source and gate-drain of the 12th FeFET ($F_{12}$) by a voltage ($-V_W/2$) of ½ level of the negative write voltage ($-V_W$).

In addition, since a negative write voltage ($-V_W$) is applied to the second word line ($WL_2$) to the 21st FeFET ($F_{21}$) and a voltage ($-V_W/2$) of ½ level of the negative write voltage ($-V_W$) is applied to the first bit line ($BL_1$), a voltage difference is also generated between the gate-drain of the 21st FeFET ($F_{21}$) by a voltage ($-V_W/2$) of ½ level of the negative write voltage ($-V_W$).

In addition, looking at the case of writing data of 1 to the 21st FeFET ($F_{21}$) on the right in FIG. 3A, since a voltage ($V_W/2$) of ½ level of the positive write voltage ($V_W$) is applied to the first word line ($WL_1$) to the 11th FeFET ($F_{11}$) and a ground voltage is applied to the first bit line ($BL_1$) and the first source line ($SL_1$), a voltage difference is generated between the gate-source and gate-drain of the 11th FeFET ($F_{11}$) by a voltage ($V_W/2$) of ½ level of the positive write voltage ($V_W$).

In addition, since a positive write voltage ($V_W$) is applied to the second word line ($WL_2$) to the 22nd FeFET ($F_{22}$) and a voltage ($V_W/2$) of ½ level of the positive write voltage ($V_W$) is applied to the second bit line ($BL_2$) and the second source line ($SL_2$), a voltage difference is also generated between the gate-source and gate-drain of the 22nd FeFET ($F_{22}$) by a voltage ($V_W/2$) of ½ level of the positive write voltage ($V_W$).

That is, write disturbance occurs in which the heat generated from each of the cells in which the write operations are performed makes the electrical state of other adjacent cells unstable. In particular, as shown on the right side in FIG. 3A, there is a problem in that the threshold voltage ($V_{TH}$) of the 22nd FeFET ($F_{22}$) that has been raised to the second threshold voltage ($V_{TH2}$) may be lowered again.

Moreover, during the two-step operation, at least one voltage level swing is required for all bit lines ($BL_1$, $BL_2$), two voltage level swings are required for the word lines ($WL_1$, $WL_2$), and in the second step, one voltage level swing is also required for the selected source line ($SL_2$), and thus there is a disadvantage that the power consumption is large.

Figure 4A:
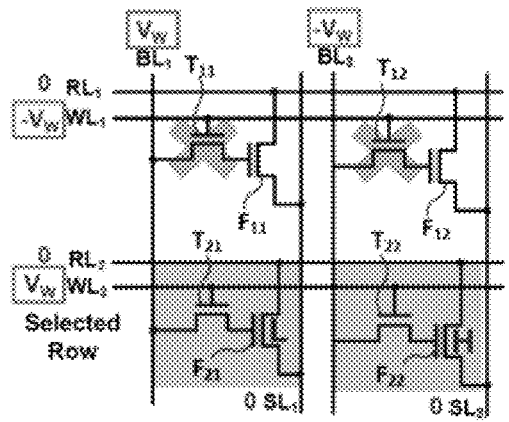
FIGS. 4A and 4B are a diagram for explaining a read/write operation of a ferroelectric random access memory device having a 1T+1FeFET structure.
Figure 4B:
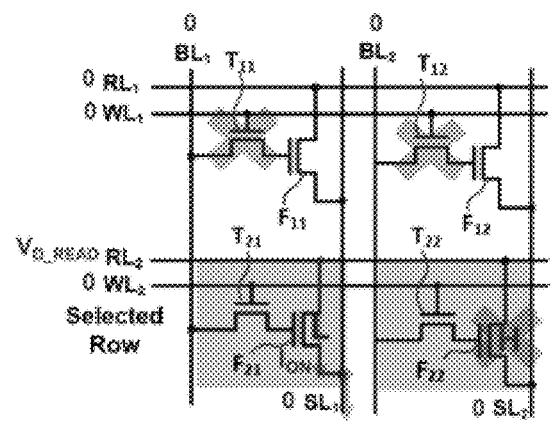

FIGS. 4A and 4B are a diagram for explaining a read/write operation of a ferroelectric random access memory device having a 1T+1FeFET structure. Also FIG. 4A shows a write operation, and FIG. 4B shows a read operation.

In addition, FIGS. 4A and 4B also show only four memory cells by way of example, each memory cell being defined by a plurality of word lines (WL), a plurality of read lines (RL), a plurality of bit lines (BL) and a plurality of source lines (SL), and consisting of one transistor ($T_{11}$, $T_{12}$, $T_{21}$, $T_{22}$) and one FeFET ($F_{11}$, $F_{12}$, $F_{21}$, $F_{22}$).

Referring to FIGS. 4A and 4B, in the ferroelectric random access memory device of the 1T+1FeFET structure, a drain and a source of the FeFET ($F_{11}$, $F_{12}$, $F_{21}$, $F_{22}$) of each memory cell are respectively connected to the corresponding read lines ($RL_1$, $RL_2$) and source lines ($SL_1$, $SL_2$). In addition, transistors ($T_{11}$, $T_{12}$, $T_{21}$, $T_{22}$) are connected between the corresponding bit lines ($BL_1$, $BL_2$) and the gate of the corresponding FeFET ($F_{11}$, $F_{12}$, $F_{21}$, $F_{22}$), and the gates are connected to the corresponding word lines ($WL_1$, $WL_2$).

As shown in FIG. 4A, the write operation of the ferroelectric random access memory device of a 1T+1FeFET structure may be performed in one step. For example, in a process of writing data of 1 and 0 to the two memory cells corresponding to the second word line ($WL_2$) as in FIGS. 3A and 3B, a pre-designated positive write voltage ($V_W$) is applied to the selected second word line ($WL_2$), and a negative write voltage ($-V_W$) is applied to the remaining unselected word line ($WL_1$). Accordingly, two transistors ($T_{21}$, $T_{22}$) whose gates are connected to the second word line ($WL_2$) to which the positive write voltage ($V_W$) is applied are turned on, thereby connecting the corresponding bit lines ($BL_1$, $BL_2$) and gates of the corresponding FeFETs ($F_{21}$, $F_{22}$). On the other hand, two transistors ($T_{11}$, $T_{12}$) whose gates are connected to the first word line ($WL_1$) to which the negative write voltage ($-V_W$) is applied maintain an off state.

In addition, a positive write voltage ($V_W$) is applied to the first bit line ($BL_1$) corresponding to the 21st FeFET ($F_{21}$) to which data of 1 is to be written, and a negative write voltage ($-V_W$) is applied to the second bit line ($BL_2$) corresponding to the 22nd FeFET ($F_{22}$) to which data of 0 is to be written. Accordingly, a positive write voltage ($V_W$) is applied to the gate of the 21st FeFET ($F_{21}$), while a negative write voltage ($-V_W$) is applied to the gate of the 22nd FeFET ($F_{22}$). At this time, the source lines ($SL_1$, $SL_2$) and the read lines ($RL_1$, $RL_2$) are maintained at the ground voltage.

Accordingly, the gate-source and gate-drain voltages of the 21st FeFET ($F_{21}$) are expressed as a positive write voltage ($V_W$), and the gate-source and gate-drain voltages of the 22nd FeFET ($F_{22}$) are expressed as a negative write voltage ($-V_W$). Accordingly, the threshold voltage ($V_{TH}$) of the 21st FeFET ($F_{21}$) is lowered to the first threshold voltage ($V_{TH1}$), while the threshold voltage ($V_{TH}$) of the 22nd FeFET ($F_{22}$) is increased to the second threshold voltage ($V_{TH2}$).

Referring to FIG. 4B, in the read process, a pre-designated drain read voltage ($V_{D\_READ}$) is applied to the second read line ($RL_2$) corresponding to the selected row, and a ground voltage is applied to the remaining read line ($RL_1$) and all bit lines ($BL_1$, $BL_2$), word lines ($WL_1$, $WL_2$) and source lines ($SL_1$, $SL_2$).

When the drain read voltage ($V_{D\_READ}$) is applied to the second read line ($RL_2$), since a current ($I_{ON}$) flows through the 21st FeFET ($F_{21}$) having the first threshold voltage ($V_{TH1}$) that is a negative threshold voltage ($V_{TH}$), whereas the 22nd FeFET ($F_{22}$) has a positive second threshold voltage ($V_{TH2}$), a current ($I_{ON}$) flows through the 21st FeFET ($F_{21}$), whereas no current flows through the 22nd FeFET ($F_{22}$). Accordingly, by measuring the current ($I_{ON}$), data stored in each of the 21st FeFET ($F_{21}$) and the 22nd FeFET ($F_{22}$) can be determined.

Although the ferroelectric random access memory device of a 1T+1FeFET structure shown in FIGS. 4A and 4B have a lower degree of integration compared to the ferroelectric random access memory device of 1FeFET structure of FIGS. 3A and 3B due to the addition of one transistor to each memory cell, it has an advantage that write disturbance does not occur during write operation. However, in the ferroelectric random access memory device of the 1T+1FeFET structure, due to the threshold voltage of the added transistor, a threshold voltage drop ($V_{TH}$ drop) occurs in which the voltage level actually applied to the gate of the 21st FeFET ($F_{21}$) is lower than the positive write voltage ($V_W$). Moreover, since during the write operation, one voltage level swing is required for all the bit lines ($BL_1$, $BL_2$) and the word lines ($WL_1$, $WL_2$), and during the read operation, the read line ($RL_2$) and the source line ($SL_1$) are driven to generate static current flow, there is still a problem of large power consumption.

Here, the reason that the ferroelectric random access memory device does not reliably sense a voltage and measure a current to determine data is because a sneak current may occur.

As shown in FIG. 4B, when applying a pre-designated drain read voltage ($V_{D\_READ}$) to the selected second read line ($RL_2$) and applying a ground voltage to the remaining read line ($RL_1$), all the bit lines ($BL_1$, $BL_2$), the word lines ($WL_1$, $WL_2$) and the source lines ($SL_1$, $SL_2$), if, for example, the 11th FeFET ($F_{11}$) connected to the same source line ($SL_1$) as the 21st FeFET ($F_{21}$) in which data of 1 is stored has a first threshold voltage ($V_{TH1}$) that is a negative threshold voltage ($V_{TH}$), that is, if data of 1 is stored in the 11th FeFET ($F_{11}$) of the unselected row, a sneak current occurs in which the current flowing to the source line ($SL_1$) through the 21st FeFET ($F_{21}$) also flows to the unselected read line ($RL_1$) through the 11th FeFET ($F_{11}$). Due to this sneak current, the voltage level of the source line ($SL_1$) is changed. Therefore, the data cannot be determined by sensing the voltage.

Figure 5A:
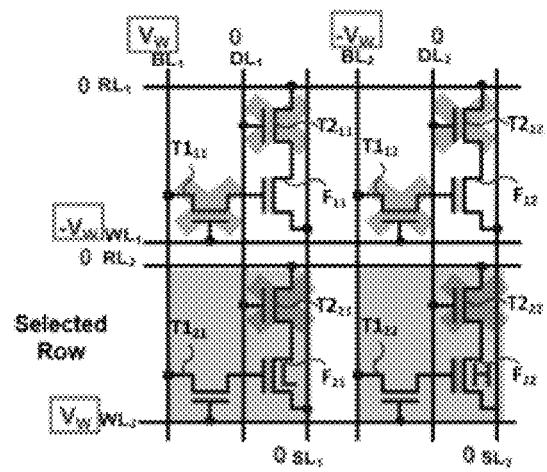
FIGS. 5A and 5B are a diagram for explaining a read/write operation of a ferroelectric random access memory device having a 2T+1FeFET structure.
Figure 5B:
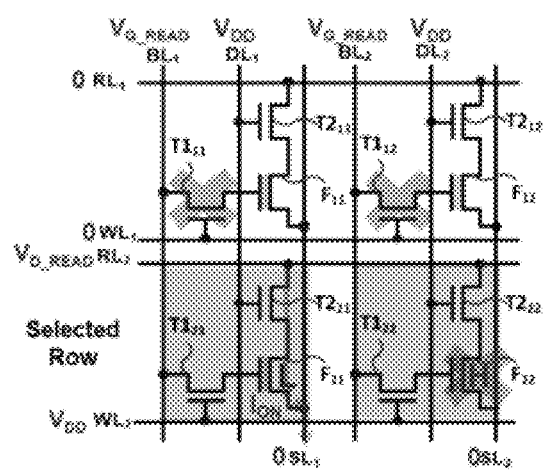

FIGS. 5A and 5B are diagrams for explaining a read/write operation of a ferroelectric random access memory device having a 2T+1FeFET structure.

In FIGS. 5A and 5B, each memory cell further comprises, in addition to one transistor ($T1_{11}$, $T1_{12}$, $T1_{21}$, $T1_{22}$) and one FeFET ($F_{11}$, $F_{12}$, $F_{21}$, $F_{22}$), one transistor ($T2_{11}$, $T2_{12}$, $T2_{21}$, $T2_{22}$) connected between the drain of the FeFET ($F_{11}$, $F_{12}$, $F_{21}$, $F_{22}$) and the read line ($RL_1$, $RL_2$), and gates of the added transistors ($T2_{11}$, $T2_{12}$, $T2_{21}$, $T2_{22}$) are connected to corresponding data lines ($DL_1$, $DL_2$).

Referring to FIG. 5A, in the write operation of the ferroelectric random access memory device of a 2T+1FeFET structure, similarly to the ferroelectric random access memory device of a 1T+1FeFET structure, a pre-designated positive write voltage ($V_W$) is applied to the selected second word line ($WL_2$), and a negative write voltage ($-V_W$) is applied to the remaining unselected word line ($WL_1$). In addition, a positive write voltage ($V_W$) is applied to the first bit line ($BL_1$) corresponding to the 21st FeFET ($F_{21}$) to which data of 1 is to be written, and a negative write voltage ($-V_W$) is applied to the second bit line ($BL_2$) corresponding to the 22nd FeFET ($F_{22}$) to which data of 0 is to be written. At this time, the source lines ($SL_1$, $SL_2$), the read lines ($RL_1$, $RL_2$) and the data lines ($DL_1$, $DL_2$) are maintained at the ground voltage.

Meanwhile, referring to FIG. 5B, in the read operation, it is the same as the ferroelectric random access memory device of a 1T+1FeFET structure of FIGS. 4A and 4B in that a pre-designated drain read voltage ($V_{D\_READ}$) is applied to the second read line ($RL_2$) corresponding to the selected row, and a ground voltage is applied to the remaining read line ($RL_1$) and source lines ($SL_1$, $SL_2$). Accordingly, one voltage level swing is still required for all the bit lines ($BL_1$, $BL_2$) and the word lines ($WL_1$, $WL_2$), resulting in high power consumption.

However, during the read operation of the ferroelectric random access memory device of a 2T+1FeFET structure, a pre-designated gate read voltage ($V_{G\_READ}$) is applied to the bit lines ($BL_1$, $BL_2$), and a pre-designated data voltage ($V_{DD}$) is applied to the data lines ($DL_1$, $DL_2$). Accordingly, the ferroelectric random access memory device of a 2T+1FeFET structure has additional transistors ($T2_{11}$, $T2_{12}$, $T2_{21}$, $T2_{22}$) on the path through which the read current ($I_{ON}$) flows, so that it reduces the amount of static current during read operation compared to a ferroelectric random access memory device of a 1T+1FeFET structure, however a static current still flows, thus the current consumption is not small, and since each memory cell is provided with two transistors, there is a limitation in that the degree of integration is lowered.

In particular, due to the need to use a negative level voltage as well as a positive level voltage, there is a problem in that the configuration of the power supply is very complicated.

Figure 6:
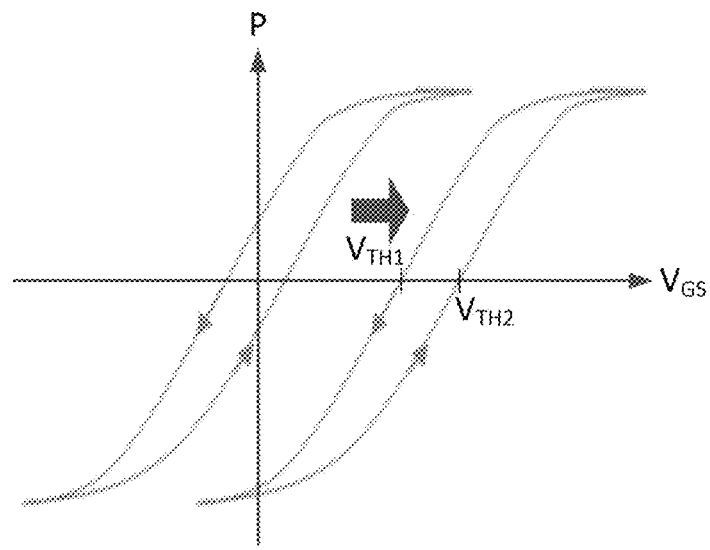
FIG. 6 shows a hysteresis characteristic of a ferroelectric random access memory element according to an embodiment of the present disclosure.

FIG. 6 shows a hysteresis characteristic of a ferroelectric random access memory element according to an embodiment of the present disclosure.

The pattern of the hysteresis curve of the FeFET element shown in FIG. 1 may be variously modified through structural change or composition change, including the gate electrode structure change or the addition of a metal layer inside ferroelectric layer, in the FeFET element. Accordingly, in this embodiment, as shown in FIG. 6, the pattern of the hysteresis curve of the FeFET element is shifted in the positive voltage direction, and in particular, the pattern of the hysteresis curve of the FeFET element is shifted such that the first threshold voltage ($V_{TH1}$) of a low voltage level becomes a positive voltage level. Accordingly, both the first threshold voltage (Van) and the second threshold voltage ($V_{TH2}$) may have positive voltage levels (here, for example, 0.68V and 1.58V).

As shown in FIG. 6, a technique for shifting a pattern of a hysteresis curve of an FeFET element in a positive voltage direction is a known technique, and thus detailed description thereof will be omitted.

Figure 7:
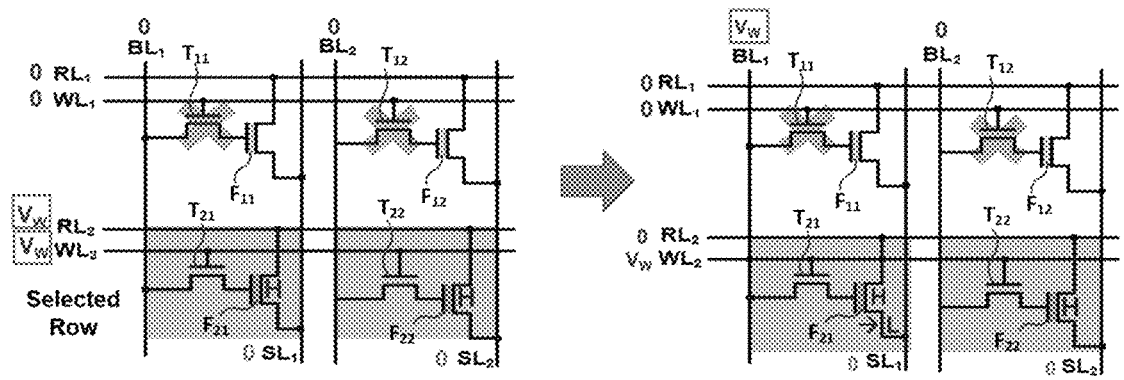
FIG. 7 is a diagram for explaining a write operation of a ferroelectric random access memory device according to an embodiment of the present disclosure.
Figure 8:
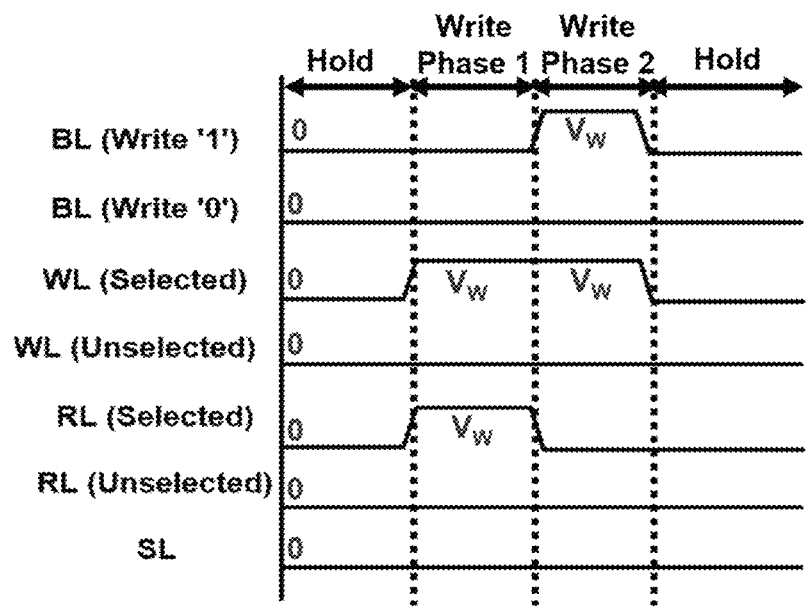
FIG. 8 shows a write timing diagram of the ferroelectric random access memory of FIG. 7.

FIG. 7 is a diagram for explaining a write operation of a ferroelectric random access memory device according to an embodiment of the present disclosure, and FIG. 8 shows a write timing diagram of the ferroelectric random access memory of FIG. 7.

Referring to FIG. 7, the structure of the ferroelectric random access memory device according to the present disclosure is basically the same as that of the 1T+1FeFET ferroelectric random access memory device shown in FIGS. 4A and 4B. That is, it includes a memory cell array including a plurality of memory cells defined by a plurality of word lines (WL), a plurality of read lines (RL), a plurality of bit lines (BL) and a plurality of source lines (SL), each memory cell consisting of one transistor ($T_{11}$, $T_{12}$, $T_{21}$, $T_{22}$) and one FeFET ($F_{11}$, $F_{12}$, $F_{21}$, $F_{22}$). However, in this embodiment, the FeFETs ($F_{11}$, $F_{12}$, $F_{21}$, $F_{22}$) are implemented as FeFET elements in which the pattern of the hysteresis curve is shifted in the positive voltage direction as shown in FIG. 6.

In each memory cell, both ends of the FeFET ($F_{11}$, $F_{12}$, $F_{21}$, $F_{22}$) are connected between the corresponding read lines ($RL_1$, $RL_2$) and the source lines ($SL_1$, $SL_2$) among the plurality of read lines (RL) and the plurality of source lines (SL). In addition, the transistor ($T_{11}$, $T_{12}$, $T_{21}$, $T_{22}$) is connected between the corresponding bit lines ($BL_1$, $BL_2$) among the plurality of bit lines (BL) and the gate of the corresponding FeFET $F_{12}$, $F_{21}$, $F_{22}$), and the gate is connected to the corresponding word line ($WL_1$, $WL_2$) among the plurality of word lines (WL).

That is, each transistor ($T_{11}$, $T_{12}$, $T_{21}$, $T_{22}$) is turned on/off according to a voltage level applied to the corresponding word line ($WL_1$, $WL_2$) connected to the gate to electrically connect or block the corresponding bit line ($BL_1$, $BL_2$) and the gate of the FeFET ($F_{11}$, $F_{12}$, $F_{21}$, $F_{22}$).

In FIG. 7, it is shown as an example that the plurality of word lines (WL) and the plurality of read lines (RL) are arranged to run in parallel in a first direction, and that the plurality of bit lines (BL) and the plurality of source lines (SL) are arranged to run in parallel in a second direction perpendicular to the first direction, however, the running direction of each line may be different depending on the design of the memory cell array.

When the write operation of the ferroelectric random access memory device of FIG. 7 is described with reference to the timing diagram of FIG. 8, the write operation of the ferroelectric random access memory device according to the present embodiment also consists of two steps.

Here again, the description will be made on the assumption that data is written to the memory cell arranged in the second row as an example, and it is assumed that, in the second row, data of 1 is written to the memory cell of the first column and data of 0 is written to the memory cell of the second column.

First, in the first step, a pre-designated positive write voltage ($V_W$) (for example, 4V) is applied only to the second word line ($WL_2$) and the second read line ($RL_2$) corresponding to the row selected to write data (here, the second row), the plurality of source lines (SL) are floated, and all other lines are maintained at a ground voltage with a voltage level lower than the positive write voltage ($V_W$). That is, the same positive write voltage ($V_W$) is applied only to two lines, the second word line ($WL_2$) and the second read line ($RL_2$).

As the positive write voltage ($V_W$) is applied to the second word line ($WL_2$), the two transistors ($T_{21}$, $T_{22}$) whose gates are connected to the second word line ($WL_2$) are turned on, thereby connecting the corresponding bit lines ($BL_1$, $BL_2$) and the gates of the corresponding FeFETs ($F_{21}$, $F_{22}$).

Since all the bit lines ($BL_1$, $BL_2$) maintain the ground voltage, the positive write voltage ($V_W$) is also applied to the second read line ($RL_2$), and the source lines (SL) are in a floating state, a reverse voltage difference by the positive write voltage ($V_W$) is generated between the gate-drain of each of the 21st and 22nd FeFETs ($F_{21}$, $F_{22}$). Accordingly, the threshold voltage ($V_{TH}$) of the 21st and 22nd FeFETs ($F_{21}$, $F_{22}$) is increased to the second threshold voltage ($V_{TH2}$) of a relatively high voltage level (for example, 1.58V) among the first and second threshold voltages ($V_{TH1}$, $V_{TH2}$) according to the hysteresis characteristic of the FeFET. That is, data of 0 is written to all memory cells of the selected row.

In FIGS. 4A, 4B, 5A and 5B, the word line (WL) and the read line (RL) are used separately for a write operation and a read operation, respectively, however in the present disclosure, a positive write voltage ($V_W$) is applied to the read line ($RL_2$) corresponding to the memory cell selected in the first step during a write operation. However, since all the bit lines ($BL_1$, $BL_2$) connected to the gates of the 21st and 22nd FeFETs ($F_{21}$, $F_{22}$) maintain the ground voltage, and thus the FeFETs ($F_{21}$, $F_{22}$) maintain the off state, even when the positive write voltage ($V_W$) is applied to the read line ($RL_2$), the read line ($RL_2$) is only charged with the positive write voltage ($V_W$), a current path with the corresponding source line ($SL_1$, $SL_2$) is not formed, and thus the power consumption is very negligible. In addition, since the second word line ($WL_2$) is connected to the gates of the 21st and 22nd FeFETs ($F_{21}$, $F_{22}$), the power consumption is likewise very low.

Thereafter, in the second step, the positive write voltage ($V_W$) is still applied to the second word line ($WL_2$), and a ground voltage is applied to the second read line ($RL_2$). In addition, a positive write voltage ($V_W$) is applied to the first bit line ($BL_1$) corresponding to the memory cell to which data of 1 is to be written. At this time, the unselected word line ($WL_1$), read line ($RL_1$) and bit line ($BL_2$) maintain a ground voltage, and the source lines (SL) maintain a floating state. That is, a voltage swing occurs only in the second read line ($RL_2$) and the first bit line ($BL_1$).

Accordingly, a positive write voltage ($V_W$) is applied to the gate of the 21st FeFET ($F_{21}$), a ground voltage is applied to the drain, and thus a voltage difference is generated between the gate-drain of the 21st FeFET ($F_{21}$) by the positive write voltage ($V_W$), so that the threshold voltage ($V_{TH}$) of the 21st FeFET ($F_{21}$) is lowered to the first threshold voltage ($V_{TH1}$) of a relatively low voltage level (for example, 0.68V). That is, data 1 is written to the corresponding memory cell. At this time, since a ground voltage is applied to the gate of the 22nd FeFET ($F_{22}$) through the second bit line ($BL_2$), a gate-drain voltage difference does not occur, thereby maintaining the second threshold voltage ($V_{TH2}$).

That is, the ferroelectric random access memory device according to the present embodiment is configured to, when writing data to a memory cell arranged in a selected row, swing only the voltage level applied to one word line ($WL_2$) and one read line ($RL_2$) corresponding to the corresponding row and the bit line ($BL_1$) corresponding to the memory cell to which data of 1 is to be written, so that the power consumption can be greatly reduced. Moreover, since only the same positive write voltage ($V_W$) is applied to all of the lines in which the voltage level is swung, only one voltage needs to be generated as the voltage level required for the write operation. Therefore, it is possible to greatly simplify the configuration of the power supply of the ferroelectric random access memory device.

Figure 9:
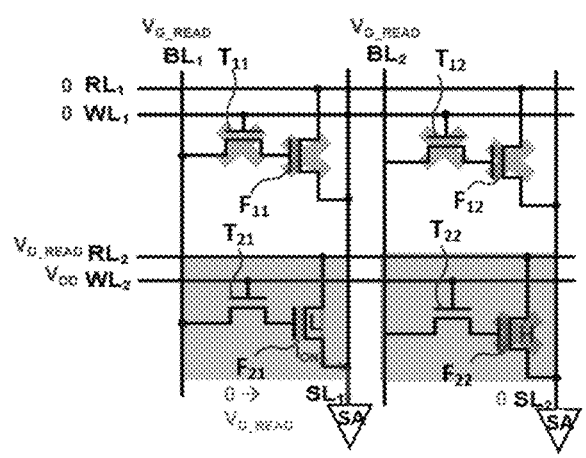
FIG. 9 is a diagram for explaining a read operation of a ferroelectric random access memory device according to an embodiment of the present disclosure.
Figure 10:
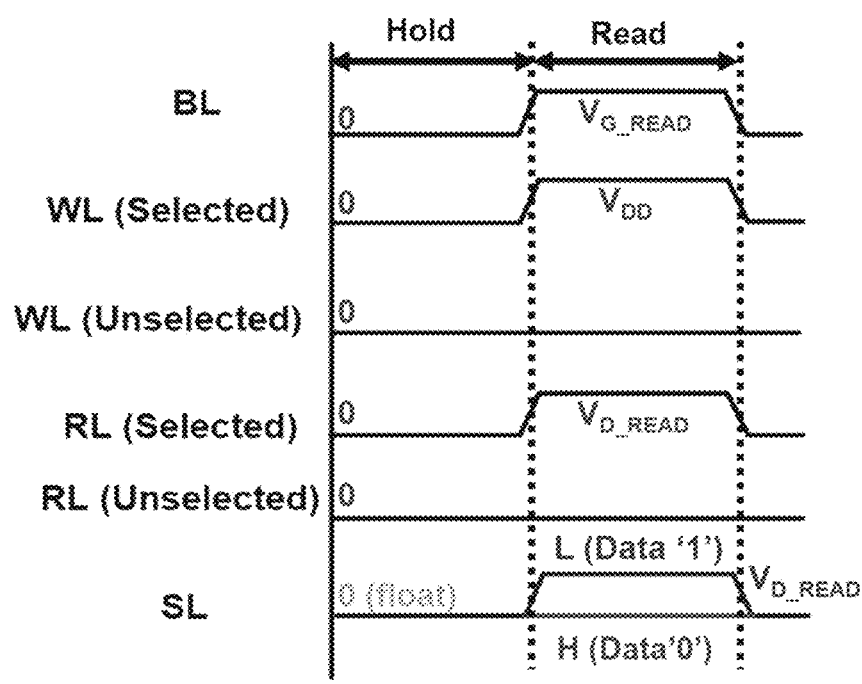
FIG. 10 shows a read timing diagram of the ferroelectric random access memory of FIG. 7.

FIG. 9 is a diagram for explaining a read operation of a ferroelectric random access memory device according to an embodiment of the present disclosure, and FIG. 10 shows a read timing diagram of the ferroelectric random access memory of FIG. 7.

FIG. 9 also shows a 1T+1FeFET ferroelectric random access memory device as in FIG. 7 as a ferroelectric random access memory device according to the present embodiment. However, in the present embodiment, the ferroelectric random access memory device is configured to detect the voltage rather than the current, unlike FIGS. 3A to 5B, during the read operation to determine the data, and thus further includes a plurality of sense amplifiers (SA) respectively connected to a plurality of source lines (SL).

When the read operation of the ferroelectric random access memory device of FIG. 9 is described with reference to FIG. 10, a pre-designated data voltage ($V_{DD}$) is applied to the word line ($WL_2$) corresponding to the selected memory cell, and a pre-designated drain read voltage ($V_{D\_READ}$) is applied to the read line ($RL_2$), so that the word line ($WL_2$) and the read line ($RL_2$) are pre-charged with the data voltage ($V_{DD}$) and drain read voltage ($V_{D\_READ}$) levels, respectively.

In addition, the unselected word line ($WL_1$) and read line ($RL_1$) are maintained at the ground voltage, a pre-designated gate read voltage ($V_{G\_READ}$) is applied to all the bit lines ($BL_1$, $BL_2$), and all source lines (SL) maintain a floating state.

That is, in the present embodiment, the word line ($WL_2$) corresponding to the selected memory cell is used by applying the data voltage ($V_{DD}$) not only during the write operation but also during the read operation.

Here, the gate read voltage ($V_{G\_READ}$) may have a voltage level (for example, 1V) between the first threshold voltage ($V_{TH1}$) and the second threshold voltage ($V_{TH2}$). In addition, the data voltage ($V_{DD}$) may be set to the same level as the gate read voltage ($V_{G\_READ}$), and the drain read voltage ($V_{D\_READ}$) may have a voltage level (for example, 1.5V) between the gate read voltage ($V_{G\_READ}$) and the positive write voltage ($V_W$).

The data voltage ($V_{DD}$) is applied to the word line ($WL_2$), and thus the two transistors ($T_{21}$, $T_{22}$) are turned on, so that the gate read voltage ($V_{G\_READ}$) applied to the bit lines ($BL_1$, $BL_2$) is applied to the gates of the 21st and 22nd FeFETs ($F_{21}$, $F_{22}$). At this time, the 21st FeFET ($F_{21}$) having a low first threshold voltage ($V_{TH1}$) is turned on in response to the gate read voltage ($V_{G\_READ}$) applied through the first bit line ($BL_1$) and the 21st transistor ($T_{21}$), however, the 22nd FeFET ($F_{22}$) is maintained in a turned-off state since it has a relatively high second threshold voltage ($V_{TH2}$). In addition, the read line ($RL_2$) pre-charged with the drain read voltage ($V_{D\_READ}$) is connected to the drains of the 21st and 22nd FeFETs ($F_{21}$, $F_{22}$), and source lines ($SL_1$, $SL_2$) in a floating state are connected to the sources, respectively.

Accordingly, the drain read voltage ($V_{D\_READ}$) applied to the drain of the 21st FeFET ($F_{21}$) through the second read line ($RL_2$) is applied to the corresponding sense amplifier (SA) through the first source line ($SL_1$). However, in the 22nd FeFET ($F_{22}$), due to the second threshold voltage ($V_{TH2}$), the drain read voltage ($V_{D\_READ}$) applied through the second read line ($RL_2$) is blocked so that the second source line ($SL_2$) maintains a floating state. That is, the drain read voltage ($V_{D\_READ}$) is not applied to the sense amplifier (SA).

Accordingly, each sense amplifier may detect the voltage level applied through the corresponding source line ($SL_1$, $SL_2$) to determine the data stored in the corresponding memory cell.

The sense amplifier (SA) is generally implemented as an OP amplifier or the like, so that no current flows from the input terminal side. Therefore, even when the drain read voltage ($V_{D\_READ}$) is applied from the second read line ($RL_2$) to the first source line ($SL_1$), the current ($I_{ON}$) flows only temporarily while the first source line ($SL_1$) is charged, and then the current ($I_{ON}$) does not flow thereafter. Accordingly, data can be read with minimal power consumption.

As a result, the ferroelectric random access memory device according to the present embodiment uses both a read line and a word line in both read and write operations, and detects data based on voltage, so that not only can it significantly reduce power consumption, but also it can read and write data with a small number of voltage levels without generating a negative voltage.

Figure 11:
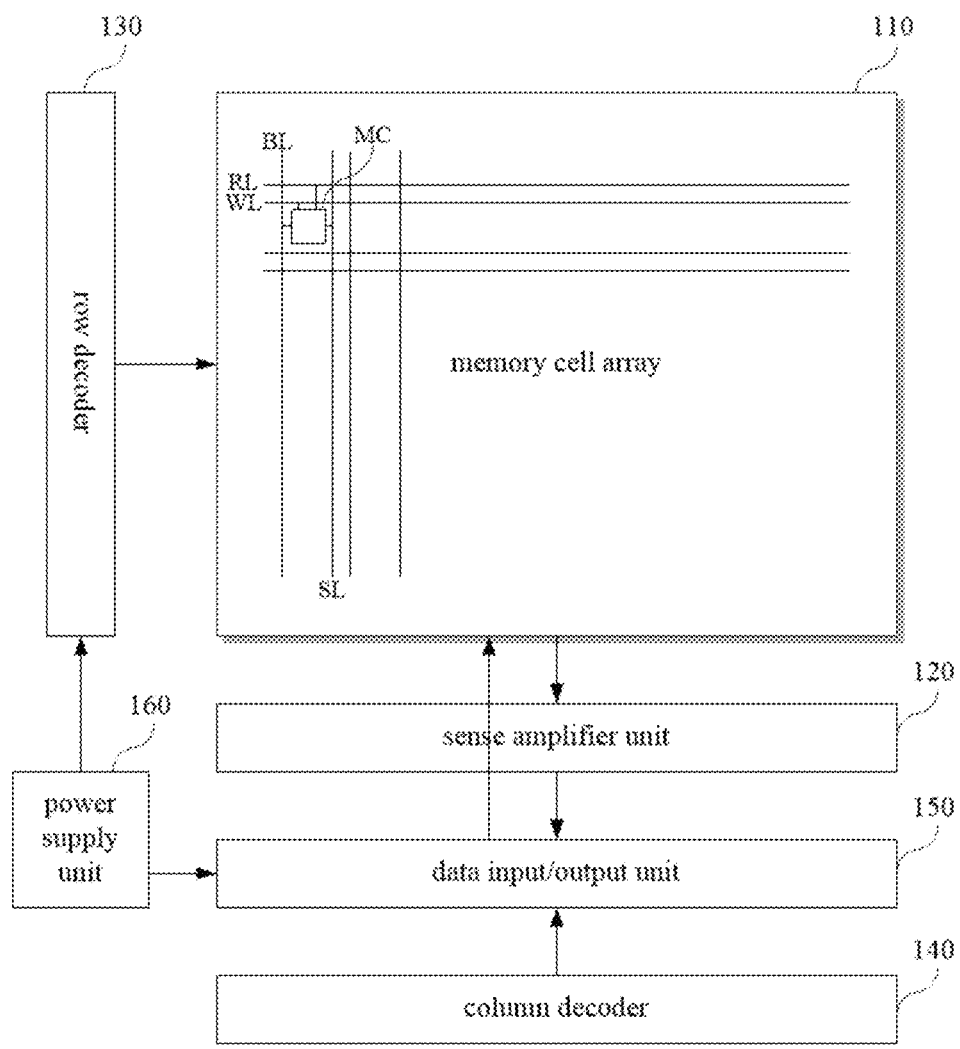
FIG. 11 shows a schematic structure of a ferroelectric random access memory device according to an embodiment of the present disclosure.

FIG. 11 shows a schematic structure of a ferroelectric random access memory device according to an embodiment of the present disclosure.

Referring to FIG. 11, the ferroelectric random access memory device of the present embodiment may include a memory cell array 110, a sense amplifier unit 120, a row decoder 130, a column decoder 140, a data input/output unit 150 and a power supply unit 160.

In the memory cell array 110, a plurality of word lines (WL), a plurality of read lines (RL), a plurality of bit lines (BL) and a plurality of source lines (SL) are arranged in a pre-designated direction, respectively, and a plurality of memory cells defined by the plurality of word lines (WL), the plurality of read lines (RL), the plurality of bit lines (BL) and the plurality of source lines (SL) are provided. In addition, as shown in FIGS. 7 and 9, each of the plurality of memory cells (MC) is composed of one transistor (T) and one FeFET (F), and can store different data according to the threshold voltage level of the FeFET.

The sense amplifier unit 120 has a plurality of sense amplifiers respectively connected to the plurality of source lines (SL) of the memory cell array 110, and detects and amplifies a voltage applied through the source lines during a read operation, and transmits it to the data input/output unit 150. That is, it determines the data stored in the selected memory cell and stores it in the data input/output unit 150.

The row decoder 130 receives a row address and a read or write command among address information applied to designate a memory cell to be read or written. The row decoder 130 decodes the row address to select the word line (WL) and the read line (RL) corresponding to the row address from among the plurality of word lines (WL) and the plurality of read lines (RL), and applies a pre-designated voltage to each of the selected word line (WL) and read line (RL) depending on whether it is a read command or a write command, thereby activating it.

When a write command is applied, the row decoder 130, in the first step, applies a pre-designated positive write voltage ($V_W$) to both the selected word line (WL) and read line (RL), and then, in the second step, applies the positive write voltage ($V_W$) to the selected word line (WL) as it is, while applying a ground voltage to the read line (RL).

On the other hand, when a read command is applied, the row decoder 130 applies a pre-designated data voltage ($V_{DD}$) to the selected word line (WL), and applies a pre-designated drain read voltage ($V_{D\_READ}$) to the selected read line (RL), thereby activating it.

The column decoder 140 receives a column address from among the address information, decodes the column address, and transmits it to the data input/output unit 150.

The data input/output unit 150 receives a read or write command, and receives the decoded column address from the column decoder 140. If the applied command is a write command, the data input/output unit 150 first applies a ground voltage to all the bit lines (BL) in the first step, and floats all source lines (SL), so that the threshold voltages of FeFETs (F) of all memory cells (MC) connected to the word line (WL) and the read line (RL) selected by the row decoder 130 become the second threshold voltage ($V_{TH2}$) of a high voltage level, so that data of 0 is written.

In the second step, it applies a positive write voltage ($V_W$) to a bit line (BL) corresponding to a memory cell to which data of 1 is to be written according to data applied corresponding to each column address, so that the threshold voltage of the FeFET (F) of the memory cell (MC) connected to the corresponding bit line (BL) becomes the first threshold voltage ($V_{TH1}$) of a low voltage level, so that data of 1 is written.

On the other hand, if the applied command is a read command, the data input/output unit 150 applies a gate read voltage ($V_{G\_READ}$) to all bit lines (BL), and receives the data amplified and determined by the plurality of sense amplifiers of the sense amplifier unit 120 and outputs it to the outside.

Here, for example, the configuration of the row decoder 130, the column decoder 140 and the data input/output unit 150 may be integrated into the read/write control unit.

The power supply unit 160 generates a positive write voltage ($V_W$), a data voltage ($V_{DD}$), a drain read voltage ($V_{D\_READ}$) and a gate read voltage ($V_{G\_READ}$), and applies the positive write voltage ($V_W$) to the row decoder 130, and outputs a data voltage ($V_{DD}$), a drain read voltage ($V_{D\_READ}$) and a gate read voltage ($V_{G\_READ}$) to the data input/output unit 150.

Figure 12:
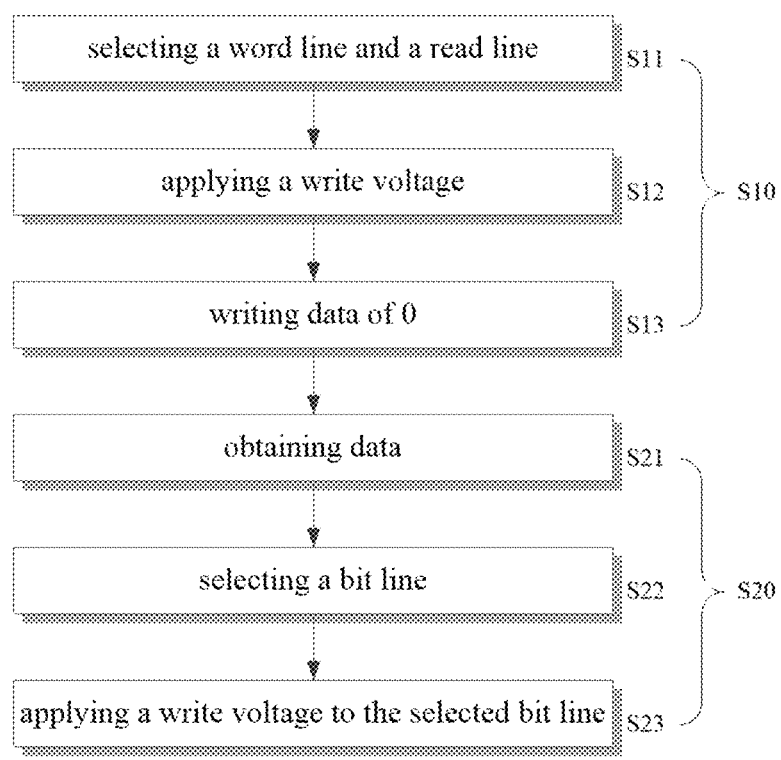
FIG. 12 shows a write method of a ferroelectric random access memory device according to an embodiment of the present disclosure.

FIG. 12 shows a write method of a ferroelectric random access memory device according to an embodiment of the present disclosure.

Referring to FIGS. 7, 8 and 11, with regard to the write method of a ferroelectric random access memory device according to the present embodiment, first, in the first step (S10), by decoding row address information among the applied address information, a word line (WL) and a read line (RL) corresponding to the row address are selected from among a plurality of word lines (WL) and a plurality of read lines (RL) (S11). That is, memory cells (MC) are selected in units of rows, among the plurality of memory cells (MC) of the memory cell array 100. Then, in response to a write command, a pre-designated positive write voltage (VW) is applied to both the selected word line (WL) and read line (RL) (S12). At this time, a ground voltage is maintained to the bit line (BL) and the remaining unselected word line (WL) and the read line (RL), and source lines are floated, so that the threshold voltages of FeFETs (F) of all memory cells (MC) connected to the selected word line (WL) and read line (RL) become the second threshold voltage ($V_{TH2}$) of a high voltage level, so that data of 0 is written (S13).

Thereafter, in the second step (S20), the column address among the applied address information is decoded, and data to be stored in each of the memory cells (MC) of the row is received and obtained (S21). Then, the bit line (BL) corresponding to the memory cell (MC) to which data of 1 is to be written is selected according to the applied data (S22). When the bit line (BL) is selected, a positive write voltage ($V_W$) is applied to the selected bit line (BL), so that the threshold voltage of the FeFET (F) of the corresponding memory cell (MC) becomes the first threshold voltage ($V_{TH1}$) of a low voltage level, so that data of 1 is written (S23).

Figure 13:
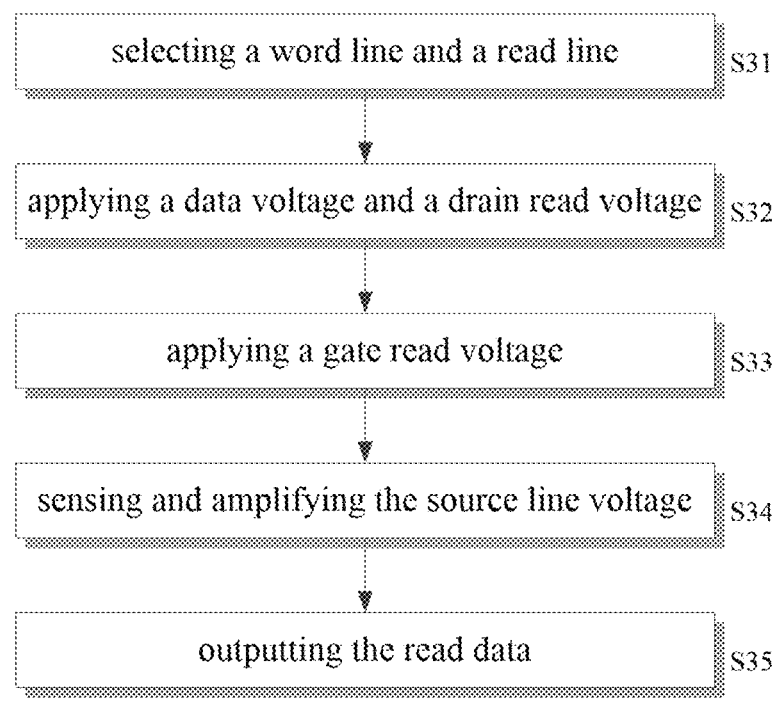
FIG. 13 shows a read method of a ferroelectric random access memory device according to an embodiment of the present disclosure.

FIG. 13 shows a read method of a ferroelectric random access memory device according to an embodiment of the present disclosure.

Referring to FIGS. 9 to 11, with regard to the write method of a ferroelectric random access memory device according to the present embodiment, by decoding row address information among the applied address information, a word line (WL) and a read line (RL) corresponding to the row address are selected from among a plurality of word lines (WL) and a plurality of read lines (RL) (S31). Then, in response to a read command, a pre-designated data voltage ($V_{DD}$) is applied to the selected word line (WL), and a pre-designated drain read voltage ($V_{D\_READ}$) is applied to the selected read line (RL) (S32).

In addition, a gate read voltage ($V_{G\_READ}$) is applied to all bit lines (BL), and all source lines (SL) are floated (S33).

Thereafter, data is determined by sensing and amplifying the voltage applied to the source line (SL) according to the threshold voltage of the FeFET (F) of each memory cell (MC) (S34). Then, the determined data is output (S35).

A method according to the present disclosure can be implemented as a computer program stored in a medium for execution on a computer. Here, the computer-readable medium can be an arbitrary medium available for access by a computer, where examples can include all types of computer storage media. Examples of a computer storage medium can include volatile and non-volatile, detachable and non-detachable media implemented based on an arbitrary method or technology for storing information such as computer-readable instructions, data structures, program modules, or other data, and can include ROM (read-only memory), RAM (random access memory), CD-ROM's, DVD-ROM's, magnetic tapes, floppy disks, optical data storage devices, etc.

While the present disclosure is described with reference to embodiments illustrated in the drawings, these are provided as examples only, and the person having ordinary skill in the art would understand that many variations and other equivalent embodiments can be derived from the embodiments described herein.

Therefore, the true technical scope of the present disclosure is to be defined by the technical spirit set forth in the appended scope of claims.

What is claimed is:

1. A ferroelectric random access memory device, comprising:
   a memory cell array including a plurality of memory cells each having one ferroelectric transistor (FeFET) connected between a corresponding read line of a plurality of read lines and a corresponding source line of a plurality of source lines and one transistor connected between a corresponding bit line of a plurality of bit lines and a gate of the FeFET and having a gate connected to a corresponding word line of a plurality of word lines; and
   a read/write control unit, when address information for a memory cell to be written is applied together with a write command and data to be stored, in a first step, selecting a word line and a read line corresponding to a row address of the address information from among a plurality of word lines and a plurality of read lines respectively, and applying a write voltage having a pre-designated positive voltage level to the selected word line and the selected read line, and in a second step, applying a ground voltage to the selected read line, and applying the write voltage to a bit line corresponding to a memory cell to which data of 1 is to be written according to a column address of the address information, the bit line being among a plurality of bit lines.

2. The ferroelectric random access memory device according to claim 1,
   wherein, in the FeFET, pattern of hysteresis curve is shifted in a positive voltage direction, so that a first threshold voltage of a relatively low voltage level for storing data of 1 and a second threshold voltage of a relatively high voltage level for storing data of 0 have positive voltage levels.

3. The ferroelectric random access memory device according to claim 2,
   wherein the read/write control unit, in the first step, applies a ground voltage to unselected word lines, read lines and the plurality of bit lines, and floats the plurality of source lines.

4. The ferroelectric random access memory device according to claim 2,
   wherein the read/write control unit, in the second step, applies a ground voltage to a bit line corresponding to a memory cell to be maintained as data of 0, and floats the plurality of source lines.

5. The ferroelectric random access memory device according to claim 2,
   wherein, when a read command and address information for a memory cell storing data to be read are applied, the read/write control unit selects a word line corresponding to a row address of the address information from among a plurality of word lines and a plurality of read lines and applies a pre-designated data voltage, selects a read line corresponding to a row address and applies a pre-designated drain read voltage, and applies a pre-designated gate read voltage to the plurality of bit lines.

6. The ferroelectric random access memory device according to claim 5,
   wherein the read/write control unit applies a ground voltage to unselected word lines and unselected read lines, and floats the plurality of source lines.

7. The ferroelectric random access memory device according to claim 6,
   wherein the ferroelectric random access memory device further comprises a sense amplifier unit comprising a plurality of sense amplifiers connected to each of the plurality of source lines to determine data stored in the memory cells by amplifying a voltage applied from the memory cells through the plurality of source lines.

8. The ferroelectric random access memory device according to claim 5,
   wherein the read/write control unit comprises:
   a row decoder receiving and decoding a row address, selecting a read line and a word line corresponding to a row address among the plurality of read lines and the plurality of word lines, applying a write voltage to the selected read line and word line in response to a write command, and applying a drain read voltage and a data voltage to the selected read line and word line, respectively, in response to a read command;
   a column decoder receiving and decoding a column address and outputting; and
   a data input/output unit, when a write command is applied, receiving the decoded column address and data to be stored, applying the write voltage to a bit line corresponding to a memory cell in which data of 1 of the received data is to be stored, and when a read command is applied, applying a gate read voltage to the plurality of bit lines to obtain data determined by a plurality of sense amplifiers.

9. The ferroelectric random access memory device according to claim 8,
   wherein the write voltage has a pre-designated voltage level higher than the second threshold voltage,
   the gate read voltage and the data voltage have a voltage level between the first threshold voltage and the second threshold voltage, and
   the drain read voltage has a voltage level between the gate read voltage and the write voltage.

10. A read/write method of a ferroelectric random access memory device, including a plurality of memory cells each having one ferroelectric transistor (FeFET) connected between a corresponding read line of a plurality of read lines and a corresponding source line of a plurality of source lines, and including one transistor connected between a corresponding bit line of a plurality of bit lines and a gate of the FeFET, the one transistor having a gate connected to a corresponding word line of a plurality of word lines, the method comprising:

a first step of, when address information for a memory cell to be written is applied together with a write command and data to be stored, selecting a word line and a read line corresponding to a row address of the address information from among a plurality of word lines and a plurality of read lines, respectively, and applying a write voltage having a pre-designated positive voltage level to the selected word line and the selected read line, thereby writing data of 0 to all memory cells in a corresponding row; and a second step of applying a ground voltage to the selected read line, and applying the write voltage to a bit line corresponding to a memory cell to which data of 1 is to be written according to a column address of the address information, the bit line being among a plurality of bit lines.

11. The read/write method of a ferroelectric random access memory device according to claim 10, wherein, in the FeFET, pattern of hysteresis curve is shifted in a positive voltage direction, so that a first threshold voltage of a relatively low voltage level for storing data of 1 and a second threshold voltage of a relatively high voltage level for storing data of 0 have positive voltage levels.

12. The read/write method of a ferroelectric random access memory device according to claim 11, wherein the first step comprises steps of:

when address information for a memory cell to be written is applied together with a write command and data to be stored, selecting a word line and a read line corresponding to a row address of the address information from among a plurality of word lines and a plurality of read lines; and applying a write voltage having a pre-designated positive voltage level to the selected word line and read line, applying a ground voltage to unselected word lines, read lines and the plurality of bit lines, and floating the plurality of source lines.

13. The read/write method of a ferroelectric random access memory device according to claim 11, wherein the second step comprises steps of:

applying the write voltage to a bit line corresponding to a memory cell to which data of 1 is to be written among a plurality of bit lines; and applying a ground voltage to a bit line corresponding to a memory cell to be maintained as data of 0, and floating the plurality of source lines.

14. The read/write method of a ferroelectric random access memory device according to claim 11, wherein the read/write method of a ferroelectric random access memory device further comprises:

a read step of, when a read command and address information for a memory cell storing data to be read are applied, reading data stored in the plurality of memory cells, wherein the read step comprises steps of:

selecting a word line corresponding to a row address of the address information from among a plurality of word lines and a plurality of read lines and applying a pre-designated data voltage, selecting a read line corresponding to a row address and applying a pre-designated drain read voltage; and applying a pre-designated gate read voltage to the plurality of bit lines.

15. The read/write method of a ferroelectric random access memory device according to claim 14, wherein the gate read voltage and the data voltage have a voltage level between the first threshold voltage and the second threshold voltage, and the drain read voltage has a voltage level between the gate read voltage and the write voltage.

16. The read/write method of a ferroelectric random access memory device according to claim 14, wherein the read step further comprises a step of:

applying a ground voltage to unselected word lines and unselected read lines, and floating the plurality of source lines.

17. The read/write method of a ferroelectric random access memory device according to claim 16, wherein the read step further comprises a step of:

determining data stored in the memory cells by amplifying a voltage applied through the source lines from the memory cells using a plurality of sense amplifiers connected to each of the plurality of source lines.

* * * * *